US006897702B2

(12) United States Patent
Khieu et al.

(10) Patent No.: US 6,897,702 B2
(45) Date of Patent: May 24, 2005

(54) PROCESS VARIATION COMPENSATED HIGH VOLTAGE DECOUPLING CAPACITOR BIASING CIRCUIT WITH NO DC CURRENT

(75) Inventors: Cong Q. Khieu, San Jose, CA (US); Chaidir Tjakra, Foster City, CA (US); Louise Gu, Fremont, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 231 days.

(21) Appl. No.: 10/158,984

(22) Filed: May 30, 2002

(65) Prior Publication Data

US 2003/0222698 A1 Dec. 4, 2003

(51) Int. Cl.⁷ .............................................. H03K 5/08
(52) U.S. Cl. ...................... 327/313; 327/321; 327/328
(58) Field of Search ................................ 327/309, 310, 327/313, 314, 319–321, 325, 327, 328, 331, 536, 541, 543; 361/90, 56, 91.1, 91.5, 92

(56) References Cited

U.S. PATENT DOCUMENTS

| | | | | |
|---|---|---|---|---|
| 4,833,342 A | * | 5/1989 | Kiryu et al. ................. 327/541 |
| 5,355,033 A | * | 10/1994 | Jang ............................ 327/541 |
| 5,872,697 A | | 2/1999 | Christensen et al. ........ 361/313 |
| 5,895,966 A | | 4/1999 | Penchuk ...................... 257/690 |
| 5,973,910 A | | 10/1999 | Gardner ....................... 361/313 |
| 6,066,971 A | * | 5/2000 | Pappert et al. ............... 327/541 |
| 6,222,260 B1 | | 4/2001 | Liang et al. ................. 257/691 |
| 6,271,706 B1 | * | 8/2001 | Nair ............................ 327/314 |
| 6,285,052 B1 | | 9/2001 | Draper ........................ 257/300 |
| 6,303,457 B1 | | 10/2001 | Christensen et al. ......... 438/396 |
| 6,307,250 B1 | | 10/2001 | Krauter et al. .............. 257/532 |
| 6,388,470 B1 | * | 5/2002 | Mattos et al. ................. 326/81 |
| 6,646,486 B2 | * | 11/2003 | Uchiki et al. ............... 327/202 |
| 6,670,845 B1 | * | 12/2003 | Fong .......................... 327/541 |

* cited by examiner

*Primary Examiner*—Long Nguyen
(74) *Attorney, Agent, or Firm*—Zagorin O'Brien Graham LLP

(57) ABSTRACT

Disclosed is a high voltage decoupling capacitor-biasing circuit with no dc current. In one embodiment, the circuit includes a power supply node, a ground node, a common node, a first p-channel FET, a first n-channel FET, and a common node biasing circuit. The first p-channel FET includes a source, gate, and drain, wherein the source and drain of the first p-channel FET are coupled to the power supply node, and wherein the gate of the first p-channel FET is coupled to the common node. The first n-channel FET includes a source, gate, and drain, wherein the source and drain of the first n-channel FET are coupled to the ground node, and wherein the gate of the first n-channel FET is coupled to the common node. The common node biasing circuit is coupled between the power supply and ground nodes. The common node biasing circuit is configured to maintain the common node at a predetermined voltage above ground by charging up or charging down the common node. Further, the common node biasing circuit is configured to transmit only AC current to or from the ground node.

21 Claims, 4 Drawing Sheets

PROCESS VARIATION COMPENSATED HIGH VOLTAGE DECOUPLING CAPACITOR BIASING CIRCUIT WITH NO DC CURRENT

BACKGROUND OF THE INVENTION

Electronic circuits, including microprocessors, have in recent years become increasingly powerful and fast. As circuit frequencies increase, noise on power supply and ground lines coupled to the microprocessor increasingly becomes a problem. This noise can arise due to, for example, well known inductive and capacitive parasitics.

Decoupling capacitors are often used to reduce this noise on power supply and ground. Ideally, the decoupling capacitors are connected between the power supply and ground lines. Additionally, the decoupling capacitors are placed as close as possible to circuits, such as input/output (IO) devices, of the microprocessor that are susceptible to noise. The decoupling capacitor may be integrally formed on the microprocessor. However, such a capacitor would be costly to manufacture using prior art methodologies. In particular, a typical processing sequence would require a deposition, patterning, and etch of a first dielectric layer, to isolate underlying metal layers of the microprocessor substrate from the capacitor. Depositing, patterning and etching a first metal layer could form, following the first dielectric layer, the lower plate of the capacitor. Then, depositing, patterning and etching a second dielectric layer could form the inter-plate dielectric. Next, a second metal layer forming the second plate of the capacitor could be deposited, patterned and etched followed by a final dielectric layer deposition, patterning and etch to isolate the capacitor. The various patterning and etch steps are needed in order to connect one plate of the capacitor to power and the other to ground, as well as to provide vias for interconnection from one or more metal layers below the capacitor to one or more metal layers above the capacitor.

As an alternative, n-channel or p-channel metal oxide semiconductor field effect transistor can be integrally formed on microprocessors and coupled to function as decoupling capacitors. Hereinafter, n-channel metal oxide semiconductor field effect transistors will be referred to as n-channel FETs, while p-channel metal oxide semiconductor field effect transistors will be referred as to as p-channel FETs. In one configuration, the gate of the integrally formed n-channel or p-channel FET is coupled to one of the power or ground lines or, while the drain and source of the n-channel or p-channel FET is coupled the other of the power or ground lines of the microprocessor.

N-channel or p-channel FET operation is subject to limitations. More particularly, the voltage $V_{gd}$ between the gate and drain of FETs or the voltage $V_{gs}$ between the gate and source of FETs should not exceed a gate oxide voltage limit $V_{limit}$. If $V_{gs}$ or $V_{gd}$ exceeds $V_{limit}$ in either of a p-channel or n-channel FET, damage can occur to the FET that renders it permanently inoperable.

$V_{limit}$ (also known as gate oxide integrity) depends on failure in time (FIT) rate and/or the gate area of the FET. The FIT rate requirement is provided by a system design specification. For FETs manufactured using 0.18-micron process rules, $V_{limit}$ is around 1.7 v. The sizes of FETs, including gate areas thereof, in microprocessors continue to reduce as semiconductor manufacturing technology advances. As the gate areas of FETs reduce, so does $V_{limit}$. Thus, if the voltage difference between the power supply and the ground node remains the same while the size of the n-channel or p-channel FETs reduces, n-channel or p-channel FETs can no longer be used as decoupling capacitors between power and ground lines of the microprocessor as described above.

SUMMARY OF THE INVENTION

Disclosed is a high voltage decoupling capacitor-biasing circuit with no DC current. In one embodiment, the circuit includes a power supply node, a ground node, a common node, a first p-channel FET, a first n-channel FET, and a common node biasing circuit. The first p-channel FET includes a source, gate, and drain, wherein the source and drain of the first p-channel FET are coupled to the power supply node, and wherein the gate of the first p-channel FET is coupled to the common node. The first n-channel FET includes a source, gate, and drain, wherein the source and drain of the first n-channel FET are coupled to the ground node, and wherein the gate of the first n-channel FET is coupled to the common node. The common node biasing circuit is coupled between the power supply and ground nodes. The common node biasing circuit is configured to maintain the common node at a predetermined voltage above ground by charging up or charging down the common node. Further, the common node biasing circuit is configured to transmit only AC current to the ground node.

In one embodiment, the common node biasing circuit includes a pull-up clamp circuit coupled between the power supply node and the common node and a pull-down circuit coupled between the common node and the ground node. The pull-up clamp circuit is coupled between the power supply node and the common node. The pull-up clamp circuit includes a diode-connected n-channel FET and three diode-connected p-channel FETs. One of the three diode-connected p-channel FETs is coupled in series between the other two of the three diode-connected p-channel FETs. The three diode-connected p-channel FETs are coupled in series between the power supply node and the diode-connected n-channel FET. The diode-connected n-channel FET is coupled in series between the three diode-connected p-channel FETs and the common node. The pull-down circuit is coupled between the common node and the ground node. The pull-down clamp circuit includes a pair of diode-connected n-channel FETs and a pair of diode-connected p-channel FETs. The pair of diode-connected p-channel FETs are coupled in series between the common node and the two diode-connected n-channel FETs. The two diode-connected n-channel FETs are coupled in series between the two diode-connected p-channel FETs and the ground node.

BRIEF DESCRIPTION OF THE DRAWINGS

The present invention may be better understood, and its numerous objects, features and advantages made apparent to those skilled in the art by referencing the accompanying drawings. The use of the same reference number throughout the figures designates a like or similar element.

Figure 1:
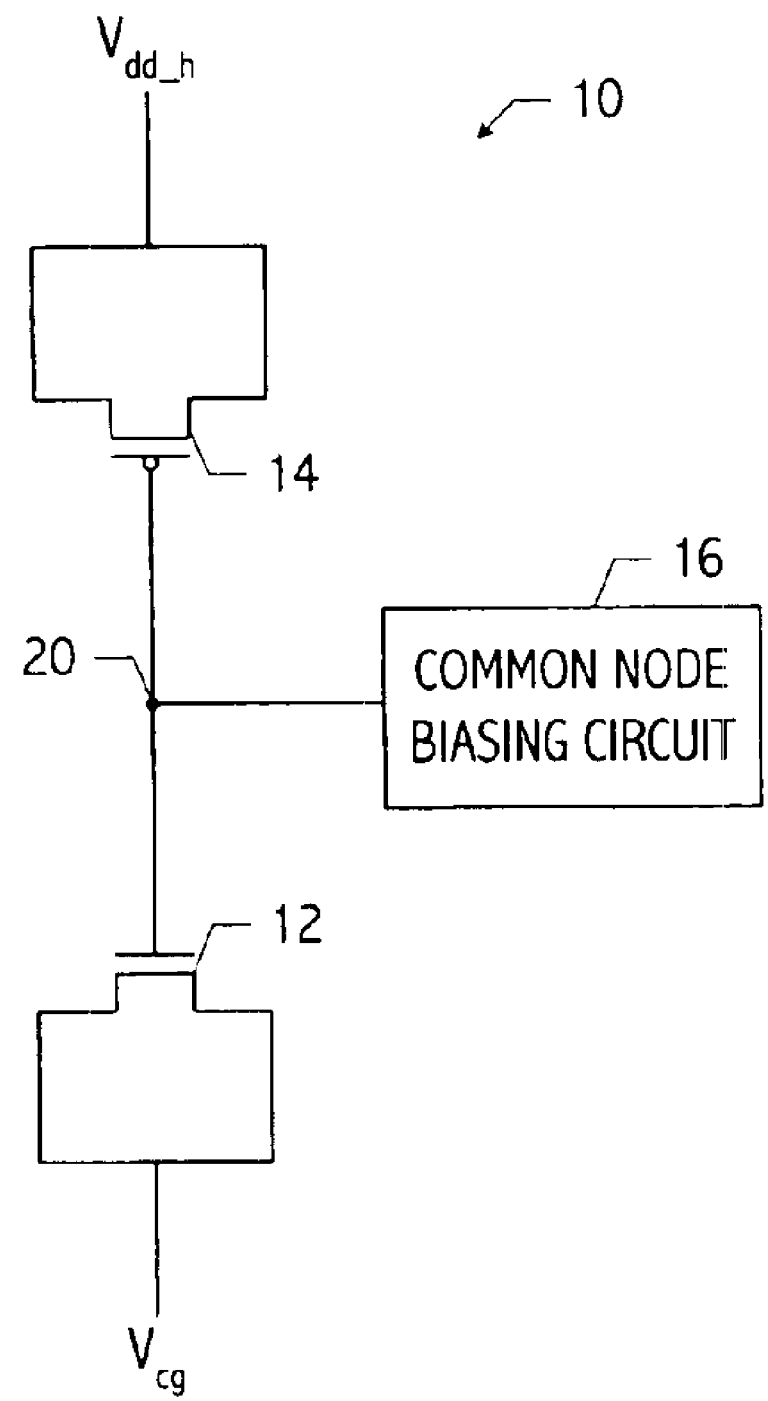
FIG. 1 illustrates a capacitive decoupling circuit according to one embodiment of the present invention.

While the invention is susceptible to various modifications and forms, specific embodiments thereof are shown by way of example in the drawings and will herein be described in detail. However, the drawings and detailed description thereto are not intended to limit the invention to the particular form disclosed. On the contrary, the intention is to cover all modifications, equivalents, and s falling within the spirit and scope of the present invention as defined by the appended claims.

DETAILED DESCRIPTION

FIG. 1 illustrates a capacitive decoupling circuit 10 integrally formed on a microprocessor (not shown) and coupled between power and ground nodes thereof. Although the present invention will be described with reference to application within a microprocessor, it should be understood that the present invention should not be limited thereto.

Circuit 10 is coupled between power node $V_{dd\_h}$ and ground node $V_{cg}$. for purposes of explanation, $V_{cg}$ is presumed to be a common ground node. Decoupling circuit includes an n-channel FET 12, a p-channel FET 14, and a common node biasing circuit 16. Although not shown, nodes Vdd_h and Vcg shown in FIG. 1 are located near one or more IO devices of the microprocessor. Although not shown, the microprocessor may contain several circuits 10 coupled between distinct pairs of nodes $V_{dd\_h}$ and $V_{cg}$ where each distinct pair of nodes $V_{dd\_h}$ and $V_{cg}$ are also coupled to IO devices of the microprocessor.

As used herein, devices or circuits (e.g., microprocessors, memory, etc.) can be coupled together either directly, i.e., without any intervening device, or indirectly, with one or more intervening devices. As used herein the term connected devices means two or more devices directly connected together without any intervening circuit via one or more conductors. The term coupled includes the term connected within its definition. The term device includes circuits or transistors coupled together to perform a function.

With continued reference to FIG. 1, n-channel FET 12 and p-channel FET 14 are coupled to function as capacitors. More particularly, the drain and source of n-channel FET 12 are both coupled to $V_{cg}$ while the gate of n-channel FET 12 is coupled to common node 20. P-channel FET 14 is likewise coupled to function as a capacitor. More particularly, the drain and source of p-channel device 14 is coupled to $V_{dd\_h}$ while the gate of p-channel FET 14 is coupled to common node 20. It is noted that the effective capacitance of p-channel FET 14, in one embodiment, equals the effective capacitance of the n-channel FET 12.

Common node biasing circuit 16 is configured to maintain common node 20 at a predetermined voltage $V_p$ between $V_{dd\_h}$ and $V_{cg}$. $V_p$ is selected so that $V_{gs}$ and $V_{gd}$ of FETs 12 and 14 do not exceed $V_{limit}$. With common node 20 at voltage $V_p$, FETs 12 and 14 should not experience the damage described in the Background section. It is noted that $V_{dd\_h}$ is greater than $V_{limit}$ for FETs 12 and 14.

Figure 2:
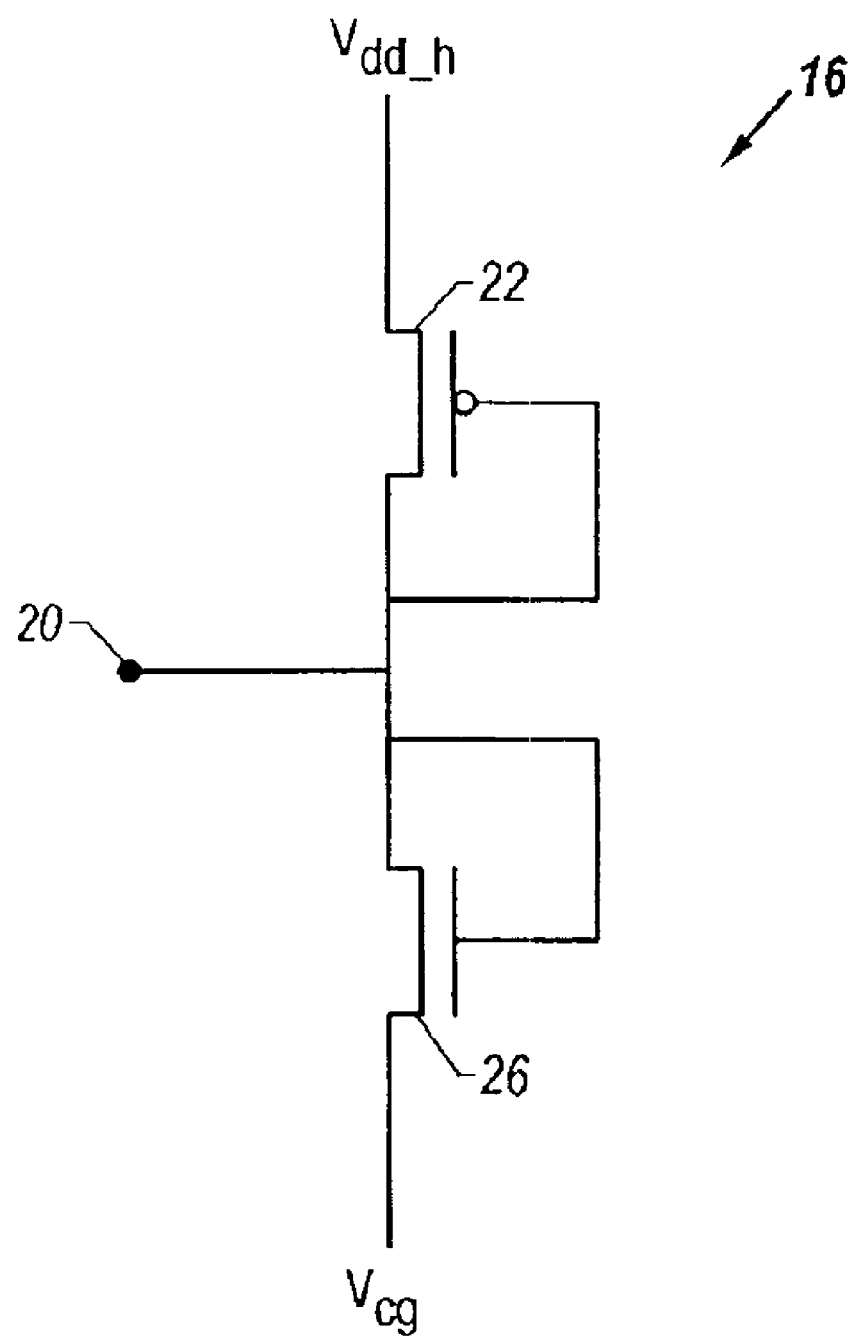
FIG. 2 is a schematic diagram of one embodiment of the common node biasing circuit shown in FIG. 1.

FIG. 2 illustrates one embodiment of the common node biasing circuit 16 shown in FIG. 1. Common node biasing circuit 16 shown in FIG. 2 includes a p-channel FET 22, an n-channel FET 26, and an output coupled to common node 20. P-channel FET 22 and n-channel FET 26 are coupled between power $V_{dd\_h}$ node and ground node $V_{cg}$. The output node is coupled between FETs 22 and 26. Because the gates and drains of FETs 22 and 26 are coupled together, FETs 22 and 26 maintain node 20 at voltage $V_p$.

While the common node biasing circuit 16 shown in FIG. 2 is capable of maintaining common node 20 shown in FIG. 1 at $V_p$ thereby precluding any damage as a result $V_{gs}$ or $V_{gd}$ in FETs 12 and 14 exceeding $V_{limit}$, FETs 22 and 26 are continuously on, and the common node biasing circuit 16 shown in FIG. 2 consumes substantial power.

Figure 3:
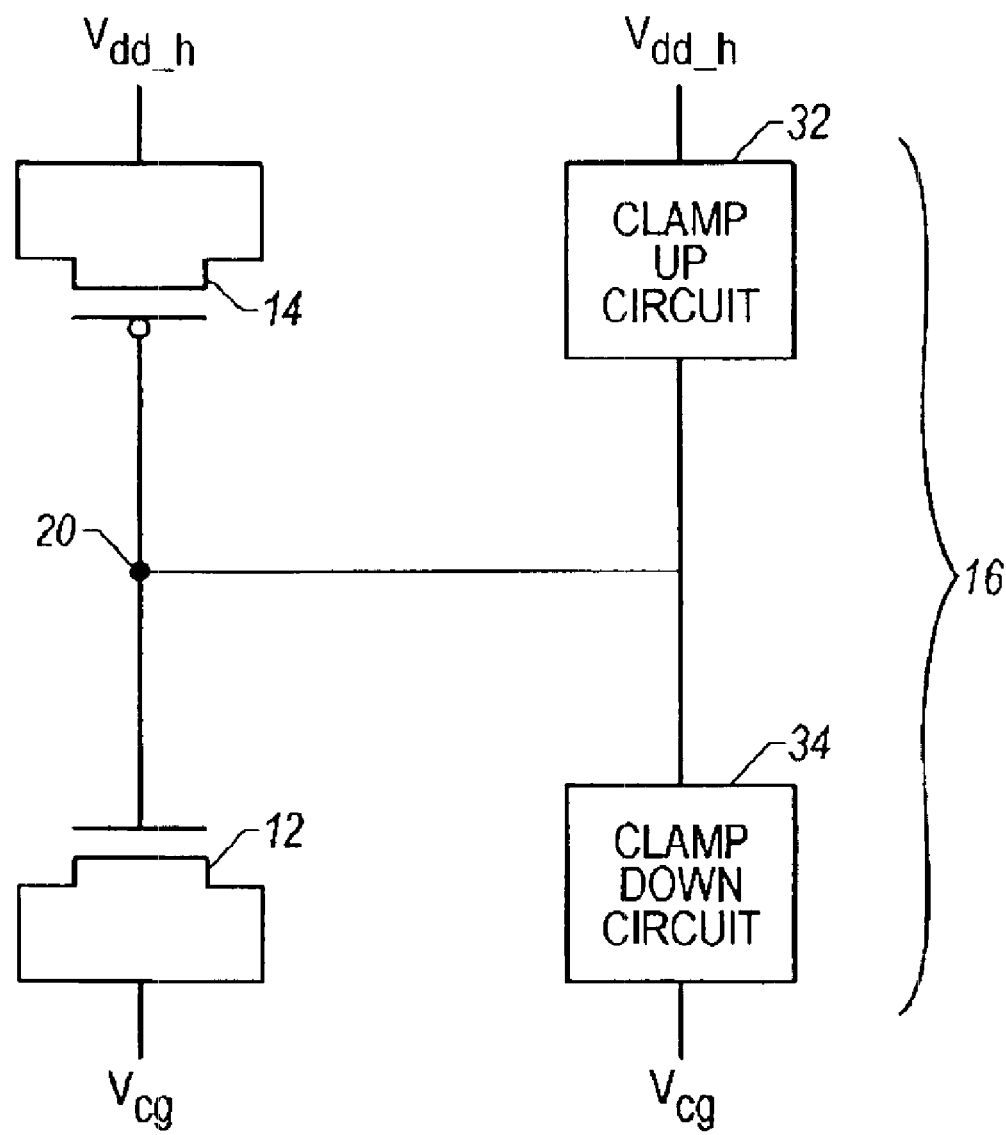
FIG. 3 illustrates another embodiment of the common node biasing circuit shown in FIG. 1.

FIG. 3 illustrates an alternative embodiment of the common node biasing circuit 16 shown in FIG. 1. More particularly, FIG. 3 shows a clamp-up circuit 32 and a clamp-down circuit 34 coupled to common node 20. The common node biasing circuit shown in FIG. 3 is capable of maintaining the common node voltage at $V_p$ while transmitting only A/C current to $V_{cg}$ or to $V_{dd\_h}$. Thus, biasing circuit 16 shown in FIG. 3 consumes less power than biasing circuit 16 shown in FIG. 2.

Figure 4:
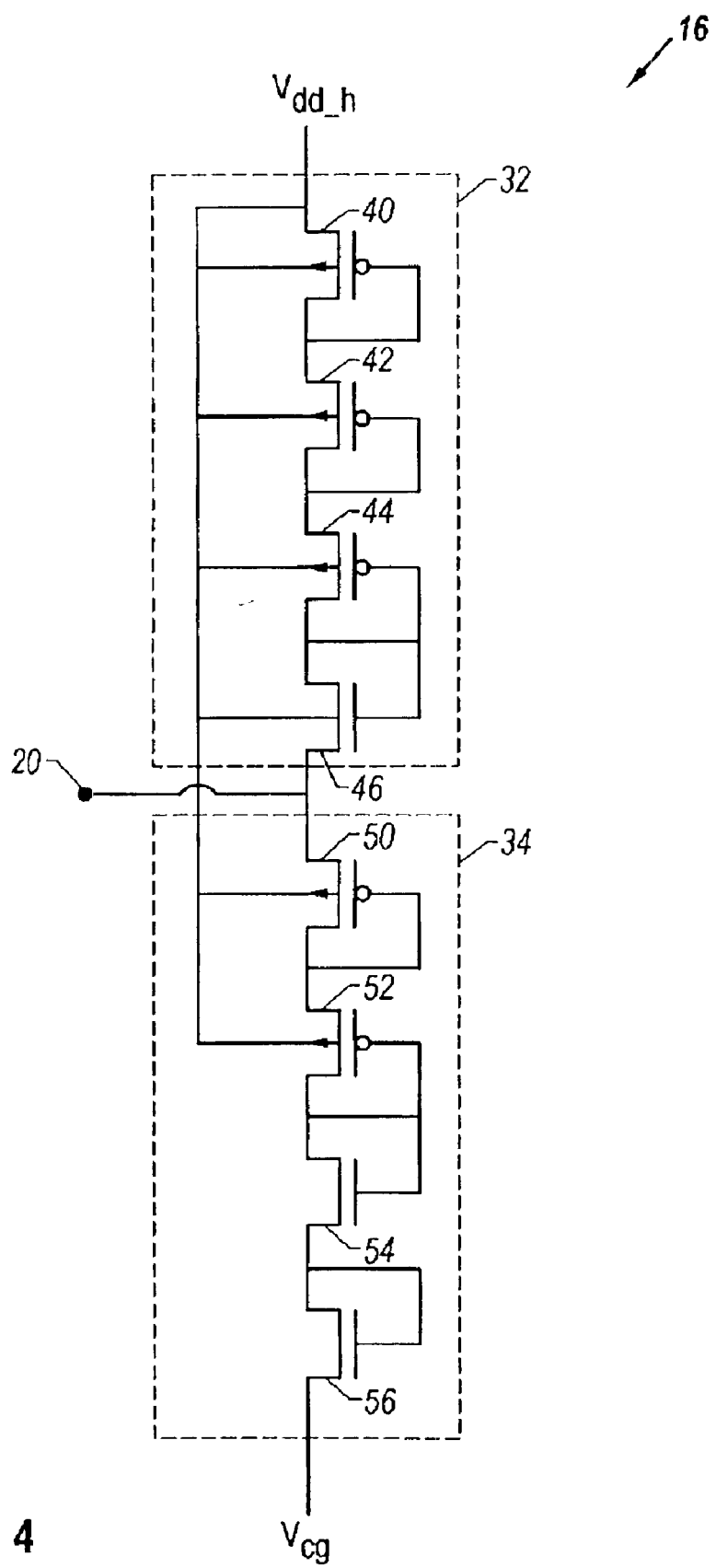
FIG. 4 is a schematic diagram of one embodiment of the common node biasing circuit shown in FIG. 3.

FIG. 4 illustrates one embodiment of the common node biasing circuit 16 shown in FIG. 3. More particularly, the clamp-up circuit 32 shown in FIG. 4 includes three p-channel FETs 40 through 44 and an n-channel FET 46. The clamp-down circuit 34 shown in FIG. 4 includes a pair of p-channel FETs 50 and 52 and a pair of n-channel FETs 54 and 56. FETs 40 through 56 shown in FIG. 4 are connected as diode-connected FETs. P-channel FETs 40 through 44 are connected in series as shown, the combination of which is connected in series between power node $V_{dd\_h}$ and n-channel FET 46. N-channel FET 46 is coupled in series between the series combination of p-channel FETs 40 through 44 and common node 20. P-channel FETs 50 and 52 are coupled in series as shown, the combination of which is coupled in series between common node 20 and n-channel FET 54. N-channel FETs 54 and 56 are connected in series as shown, the combination of which is coupled between p-channel FET 52 and $V_{cg}$.

In operation, common node biasing circuit 16 shown in FIG. 4 operates to maintain common node 20 at $V_p$. For the purposes of explanation, $V_{dd\_h}$ will be presumed to be 2.5 volts. Further, for purposes of explanation, common node biasing circuit 16 shown in FIG. 4 is configured to maintain common node 20 between 1.1 volts and 1.4 volts. When the voltage at node 20, for a variety of reasons, drifts above 1.4 volts, clamp-down circuit 34 will discharge common node 20 using only A/C current until common node 20 returns to be within the range of 1.1-1.4 volts. Likewise, if the voltage at node 20 falls below 1.1 volts, then clamp-up circuit 32 charges common node 20 back to be within the range of 1.1–1.4 volts using only A/C current. It is noted that during the charging or discharging of common node 20 to maintain common node 20 within the range of 1.1–1.4 volts, no D/C current flows through biasing circuit 16 between $V_{dd\_h}$ and $V_{cg}$. Accordingly, the common node biasing circuit 16 shown in FIG. 4 uses less power when compared to the common node biasing circuit shown in FIG. 2.

Although the present invention has been described in connection with several embodiments, the invention is not intended to be limited to the specific forms set forth herein. On the contrary, it is intended to cover such alternatives, modifications, and equivalents as can be reasonably included within the spirit and scope of the invention as defined by the appended claims.

What is claimed is:

1. An integrated circuit comprising:
    a power supply node;
    a ground node;
    a common node;
    a first p-channel FET comprising a source, gate, and drain, wherein the source and drain of the first p-channel FET are coupled to the power supply node, and wherein the gate of the first p-channel FET is coupled to the common node;
    a first n-channel FET comprising a source, gate, and drain, wherein the source and drain of the first n-channel FET are coupled to the ground node, and wherein the gate of the first n-channel FET is coupled to the common node;

a common node biasing circuit coupled between the power supply and ground nodes, wherein the common node biasing circuit comprises:

a pull-up clamp circuit coupled between the power supply node and the common node, wherein the pull-up clamp circuit comprises a diode-connected n-channel FET and three diode-connected p-channel FETs, wherein one of the three diode-connected p-channel FETs is coupled in series between the other two of the three diode-connected p-channel FETs, wherein the three diode-connected p-channel FETs are coupled in series between the power supply node and the diode-connected n-channel FET, and wherein the diode-connected n-channel FET is coupled in series between the three diode-connected p-channel FETs and the common node;

a pull-down circuit coupled between the common node and the ground node, wherein the pull-down clamp circuit comprises a pair of diode-connected n-channel FETs and a pair of diode-connected p-channel FETs, wherein the pair of diode-connected p-channel FETs are coupled in series between the common node and the two diode-connected n-channel FETs, and wherein the two diode-connected n-channel FETs are coupled in series between the two diode-connected p-channel FETs and the ground node.

2. The integrated circuit of claim 1 wherein the common node biasing circuit is configured to transmit substantially no DC current from the power supply node to the ground node.

3. The integrated circuit of claim 1 wherein the common node biasing circuit is configured to charge up the common node when the voltage at the common node falls below a predetermined voltage range, and wherein the common node biasing circuit is configured to charge down the common node when the voltage at the common node rises above the predetermined voltage range.

4. The integrated circuit, as recited in claim 3, wherein the predetermined voltage range is approximately greater than or equal to 1.1V and approximately less than or equal to 1.4V.

5. The integrated circuit of claim 1, wherein the pull-up and pull-down clamp circuits have corresponding forward turn-on voltages, a sum of the forward turn-on voltages being greater than a voltage received by the power supply node.

6. A microprocessor comprising:
a power supply node;
a ground node;
a common node;
a first p-channel FET comprising a source, gate, and drain, wherein the source and drain of the first p-channel FET are coupled to the power supply node, and wherein the gate of the first p-channel FET is coupled to the common node;
a first n-channel FET comprising a source, gate, and drain, wherein the source and drain of the first n-channel FET are coupled to the ground node, and wherein the gate of the first n-channel FET is coupled to the common node;
a common node biasing circuit coupled between the power supply and ground nodes, wherein the common node biasing circuit is configured to maintain the common node within a predetermined voltage range above ground by charging up or charging down the common node, the common node biasing circuit comprising:

a diode-connected n-channel FET coupled between the common node and the power supply node; and
at least one diode-connected p-channel FET coupled between the common node and the ground node.

7. The microprocessor of claim 6, wherein the common node biasing circuit is configured to transmit substantially no DC current from the power supply node to the ground node.

8. The microprocessor of claim 6 wherein the common node biasing circuit further comprises:
three additional diode-connected p-channel FETs, wherein one of the three additional diode-connected p-channel FETs is coupled in series between the other two of the three additional diode-connected p-channel FETs, wherein the three additional diode-connected p-channel FETs are coupled in series between the power supply node and the diode-connected n-channel FET, and wherein the diode-connected n-channel FET is coupled in series between the three additional diode-connected p-channel FETs and the common node;
a pair of diode-connected n-channel FETs wherein the pair of diode-connected n-channel FETs are coupled in series between the at least one diode-connected p-channel FET and the ground node.

9. The microprocessor of claim 6 wherein the common node biasing circuit is configured to charge up the common node when the voltage at the common node falls below the predetermined voltage range, and wherein the common node biasing circuit is configured to charge down the common node when the voltage at the common node rises above the predetermined voltage range.

10. The microprocessor, as recited in claim 9, wherein the predetermined voltage range is approximately greater than or equal to 1.1V and approximately less than or equal to 1.4V.

11. The microprocessor, as recited in claim 6, wherein the common node biasing circuit further comprises at least one p-channel FET coupled between the power supply node and the diode-connected n-channel.

12. The microprocessor, as recited in claim 6, wherein the common node biasing circuit further comprises at least one diode-connected n-channel FET coupled to the at least one diode-connected p-channel FET and the ground node.

13. A microprocessor comprising:
first and second power supply nodes;
first and second ground nodes;
first and second common nodes;
first and second p-channel FETs each comprising a gate, source, and drain;
first and second n-channel FETs each comprising a gate, source, and drain;
first and second common node biasing circuits;
wherein the source and drain of the first p-channel FET are coupled to the first power supply node, and wherein the gate of the first p-channel FET is coupled to the first common node;
wherein the source and drain of the second p-channel FET are coupled to the second power supply node, and wherein the gate of the second p-channel FET is coupled to the second common node;
wherein the source and drain of the first n-channel FET are coupled to the first ground node, and wherein the gate of the first n-channel FET is coupled to the first common node;
wherein the source and drain of the second n-channel FET are coupled to the second ground node, and wherein the gate of the second n-channel FET is coupled to the second common node;

wherein the first common node biasing circuit is coupled between the first power supply and ground nodes;

wherein the second common node biasing circuit is coupled between the second power supply and ground nodes;

wherein the first common node biasing circuit comprises:

a first pull-up clamp circuit coupled between the first power supply node and the first common node, wherein the first pull-up clamp circuit comprises a first diode-connected n-channel FET and a first combination of three diode-connected p-channel FETs, wherein one of first combination of three diode-connected p-channel FETs is coupled in series between the other two of the first combination of three diode-connected p-channel FETs, wherein the first combination of three diode-connected p-channel FETs are coupled in series between the first power supply node and the first diode-connected n-channel FET, and wherein the first diode-connected n-channel FET is coupled in series between the first combination of three diode-connected p-channel FETs and the first common node;

a first pull-down circuit coupled between the first common node and the first ground node, wherein the first pull-down clamp circuit comprises a first pair of diode-connected n-channel FET, and a first pair of diode-connected p-channel FETs, wherein the first pair of diode-connected p-channel FETs are coupled in series between the first common node and the first pair of diode-connected n-channel FETs, and wherein the first pair of diode-connected n-channel FETs are coupled in series between the first pair of diode-connected p-channel FETs and the first ground node;

wherein the second common node biasing circuit comprises;

a second pull-up clamp circuit coupled between the second power supply node and the second common node, wherein the second pull-up clamp circuit comprises a second diode-connected n-channel FET and a second combination of three diode-connected p-channel FETs, wherein one of the second combination of three diode-connected p-channel FETs is coupled in series between the other two of the second combination of three diode-connected p-channel FETs, wherein the second combination of three diode-connected p-channel FETs are coupled in series between the second power supply node and the second diode-connected n-channel FET, and wherein the second diode-connected n-channel FET is coupled in series between the second combination of three diode-connected n-channel FETs and the second common node;

a second pull-down circuit coupled between the second common node and the second ground node, wherein the second pull-down clamp circuit comprises a second pair of diode-connected n-channel FETs and a second pair of diode-connected p-channel FETs, wherein the second pair of diode-connected p-channel FETs are coupled in series between the second common node and the second pair of diode-connected n-channel FETs, and wherein the second pair of diode-connected n-channel channel FETs are coupled in series between the second pair of diode-connected p-channel FETs and the second ground node.

14. The microprocessor of claim 13 wherein the first common node biasing circuit is configured to transmit substantially no DC current from the first power supply node to the first ground node and wherein the second common node biasing circuit is configured to transmit substantially no DC current from the second power supply node to the second ground node.

15. The microprocessor of claim 13 wherein the first common node biasing circuit is configured to charge up the first common node when a voltage at the first common node falls below a first predetermined voltage range, wherein the first common node biasing circuit is configured to charge down the first common node when the voltage at the first common node rises above the first predetermined voltage range, wherein the second common node biasing circuit is configured to charge up the second common node when a voltage at the second common node falls below a second predetermined voltage range, wherein the second common node biasing circuit is configured to charge down the second common node when the voltage at the second common node rises above the second predetermined voltage range.

16. The microprocessor, as recited in claim 15, wherein the first predetermined voltage range is approximately greater than or equal to 1.1V and approximately less than or equal to 1.4V.

17. The microprocessor, as recited in claim 13, wherein the first pull-up and first pull-down clamp circuits have a first plurality of corresponding forward turn-on voltages, a sum of the first plurality of forward turn-on voltages being greater than a first voltage received by the first power supply node and the second pull-up and second pull-down clamp circuits have a second plurality of corresponding forward turn-on voltages, a sum of the second plurality of forward turn-on voltages being greater than a second voltage received by the second power supply node.

18. An integrated circuit comprising:
 a common node coupled to a first and a second capacitor; and
 a common node biasing circuit coupled to the common node, the common node biasing circuit further comprising:
  a first circuit coupled to the common node, the first circuit charging the common node in response to a voltage on the common node less than a first voltage; and
  a second circuit copied to the common node, the second circuit discharging the common node in response to a voltage on the common node greater than a second voltage,
 wherein the second voltage is greater than or equal to the first voltage and wherein the first and second circuits are effectively disabled when the voltage on the common node is less than or equal to the second voltage and greater than or equal to the first voltage, and
 wherein the first circuit further comprises at least one transistor of a first conductivity type coupled to at least one transistor of a second conductivity type opposite to the first conductivity type, the drain of the transistor of the first conductivity type being coupled to the drain of the transistor of the second conductivity type, the drain of the transistor of the first conductivity type being coupled to the gate of the transistor of the first conductivity type, the drain of the transistor of the second conductivity type being coupled to the gate of the transistor of the second conductivity type.

19. The integrated circuit, as recited in claim 18, wherein substantially no DC current flows through the common node biasing circuit.

20. The integrated circuit, as recited in claim 18, wherein the first voltage is approximately 1.1V and the second voltage is approximately 1.4V.

21. The integrated circuit, as recited in claim 18, wherein the first and second circuits have corresponding forward turn-on voltages, a sum of the forward turn-on voltages being greater than a voltage received by a power supply node.

* * * * *

UNITED STATES PATENT AND TRADEMARK OFFICE
CERTIFICATE OF CORRECTION

PATENT NO. : 6,897,702 B2
DATED : May 24, 2005
INVENTOR(S) : Khieu et al.

It is certified that error appears in the above-identified patent and that said Letters Patent is hereby corrected as shown below:

Column 4,
Line 6, the word "$V_P$" should read -- $V_P$, --.
Line 7, the words "or to $V_{dd\_h}$" should read -- or from $V_{dd\_h}$ --.

Column 8,
Line 25, please add the following after "equal to 1.4V":
-- and the second predetermined volage range is approximately greater than or equal to 1.1V and approximately less than or equal to 1.4V. --.
Line 45, the word "copied" should read -- coupled --.

Signed and Sealed this

Sixteenth Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,897,702 B2
DATED : May 24, 2005
INVENTOR(S) : Khieu et al.

It is certified that error appears in the above-identified patent and that said Letters Patent is hereby corrected as shown below:

Column 4,
Line 6, the word "$V_P$" should read -- $V_P$, --.
Line 7, the words "or to $V_{dd\_h}$" should read -- or from $V_{dd\_h}$ --.

Column 8,
Line 25, please add the following after "equal to 1.4V":
-- and the second predetermined volage range is approximately greater than or equal to 1.1V and approximately less than or equal to 1.4V. --.
Line 46, the word "copied" should read -- coupled --.

This certificate supersedes Certificate of Correction issued August 16, 2005.

Signed and Sealed this

Twenty-fifth Day of October, 2005

JON W. DUDAS
*Director of the United States Patent and Trademark Office*

UNITED STATES PATENT AND TRADEMARK OFFICE
CERTIFICATE OF CORRECTION

PATENT NO. : 6,897,702 B2
DATED : May 24, 2005
INVENTOR(S) : Khieu et al.

It is certified that error appears in the above-identified patent and that said Letters Patent is hereby corrected as shown below:

Column 4,
Line 6, "$V_P$" should read -- $V_P$, --.
Line 7, "or to $V_{dd\_h}$" should read -- or from $V_{dd\_h}$ --.

Column 8,
Line 25, add the following after "equal to 1.4V":
-- and the second predetermined voltage range is approximately greater than or equal to 1.1V and approximately less than or equal to 1.4V. --.
Line 46, "copied" should read -- coupled --.

This certificate supersedes Certificate of Correction issued August 16, 2005 and October 25, 2005.

Signed and Sealed this

Seventh Day of February, 2006

JON W. DUDAS
*Director of the United States Patent and Trademark Office*